United States Patent [19]
Sung et al.

[11] Patent Number: 5,825,234
[45] Date of Patent: Oct. 20, 1998

[54] SWITCH-CONTROL INTEGRATED CIRCUIT

[75] Inventors: Hwan-Ho Sung; Sang-Hoon Jeong, both of Seoul, Rep. of Korea

[73] Assignee: Samsung Electronics, Co., Ltd., Suwon, Rep. of Korea

[21] Appl. No.: 774,603

[22] Filed: Dec. 30, 1996

[30] Foreign Application Priority Data

Dec. 30, 1995 [KR] Rep. of Korea .................. 1995-68638

[51] Int. Cl.$^6$ ............................................... H03K 17/082
[52] U.S. Cl. ...................... 327/378; 327/434; 327/538; 327/541; 327/513
[58] Field of Search ........................... 327/538, 540, 327/541, 542, 543, 378, 513, 427, 434, 77, 83

[56] References Cited

U.S. PATENT DOCUMENTS

| | | | |
|---|---|---|---|
| 4,463,274 | 7/1984 | Swartz | 307/491 |
| 4,484,331 | 11/1984 | Miller | 372/38 |
| 5,105,102 | 4/1992 | Shioda | 307/443 |
| 5,132,565 | 7/1992 | Kuzumoto | 307/443 |
| 5,175,451 | 12/1992 | Ihara | 307/530 |
| 5,422,593 | 6/1995 | Fujihira | 327/561 |
| 5,438,545 | 8/1995 | Sim | 365/189.05 |
| 5,485,117 | 1/1996 | Furumochi | 327/538 |
| 5,578,960 | 11/1996 | Matsumura et al. | 327/535 |

*Primary Examiner*—Timothy P. Callahan
*Assistant Examiner*—An T. Luu
*Attorney, Agent, or Firm*—Marger, Johnson, McCollom & Stolowitz P.C.

[57] ABSTRACT

A switch-control integrated circuit for a switch-mode power supply (SMPS) capable of consistently limiting the peak current value of an output supply voltage irrespective of a temperature change. The circuit includes a switching transistor of the SMPS and a sensing resistor coupled to a drain of the switching transistor for sensing a drain current of the switching transistor to produce a peak current value detection voltage. A voltage generating circuit generates a feedback voltage which varies depending on the temperature condition equal to that of the sensing resistor. A comparator compares the temperature dependent voltage, received at a first input, with the temperature dependent peak current value detection voltage, received at a second input, to produce a temperature independent control signal. A protection circuit, coupled between the comparator and the switching transistor, interrupts the control signal if an abnormal operation of the voltage generating section is detected. Finally, a driving circuit drives the switching transistor in response to the control signal transmitted from the protection circuit.

6 Claims, 2 Drawing Sheets

SWITCH-CONTROL INTEGRATED CIRCUIT

BACKGROUND OF THE INVENTION

1. Field of the Invention

The present invention relates to a switch-mode power supply, and more particularly to a temperature independent switch-control integrated circuit (IC) capable of limiting the peak current value of an output supply voltage irrespective of any temperature change.

2. Description of the Prior Art

FIG. 1 illustrates the construction of a conventional switch-control IC for a switch-mode power supply (SMPS). Referring to FIG. 1, the conventional switch-control IC includes a switching transistor Q1 of the SMPS, and a sensing resistor Rs coupled to the drain electrode of transistor Q1 for sensing a drain current of the switching transistor Q1 to produce a peak current value detection voltage. A voltage generating circuit 10 generates a voltage, which is transmitted in parallel to the peak current voltage from transistor Q1, to a comparator U1. Comparator U1 produces a control signal for adjusting the duty cycle of the switching transistor Q1 in response to the two input signals. A protection circuit 20 is coupled between the comparator and switching transistor Q1 for interrupting the control signal from comparator U1 if an abnormal operation of the voltage generating section 10 is detected. Finally, the conventional switch control IC includes a driving circuit 30 for driving the switching transistor Q1 in response to the control signal transmitted from the protection circuit 20.

The conventional voltage generating circuit 10 includes a first current source CS1 for providing a first constant current I1 to a first node N1. Feedback circuit 10 also includes a second current source CS2 for providing a second constant current I2, which is less than the first constant current I1, to a second node N2. A diode D1 is coupled forwardly between the first node N1 and the second node N2, and a first Zener diode ZD1 is coupled between the first node N1 and ground. An external capacitor C1 is coupled to the second node N2, and an external current sink CS3 is coupled to the second node N2.

The protection circuit 20 includes a second Zener diode ZD2 which is turned on if a terminal voltage of the external capacitor C1 becomes greater than the Zener voltage VZ2 of the second Zener diode ZD2. A protection signal generating section PC produces a protection (i.e., cut-off control) signal if a reverse current through the Zener diode ZD2 is detected. Finally, a gate G1 regulates the transmission of the control signal to the driving circuit 30 and then the switching transistor Q1 in response to the protection signal.

During normal operation of the SMPS, the external capacitor C1 is charged by the first constant current and the second constant current (i.e., from sources CS1 and CS2, respectively). The energy then stored in the external capacitor C1 is discharged through an external current sink CS3.

However, if transient phenomena occur, or system troubles occur in the SMPS (i.e., in the event that the feedback loop becomes open), the external capacitor C1 is charged by the current provided from both the first and the second current sources CS1 and CS2. Capacitor C1 is charged by both current sources during a time interval from zero to t1, where t1 is the time in which the voltage developed across the external capacitor C1 increases from zero to the same voltage as that across the Zener diode ZD1. The charged energy is then discharged through the external current sink CS3.

Specifically, the time required for the voltage developed in the capacitor C1 to become equal to the Zener voltage VZ1 is given by the following equations:

$$C(dv/dt)=i,$$

and thus $$t=(C1/(I1+I2))\times VZ1$$

During a time interval from t1 to t2, the voltage developed across the external capacitor C1 increases from the Zener voltage VZ1 of the Zener diode ZD1 to the Zener voltage VZ2 of the Zener diode ZD2, as shown in FIG. 2. Also during that time, the current provided from the first current source CS1 is cut off by diode D1, and thus is bypassed to ground through Zener diode ZD1. Accordingly, the external capacitor C1 is charged only by the second constant current provided from the second current source CS2.

The time required for the developed voltage to become equal to the Zener voltage VZ2 is given by the following equation:

$$t=(C1/I2)\times(VZ2-VZ1)$$

Accordingly, the rate at which the voltage increases across capacitor C1 during the time interval t1–t2 is much less than that during the time interval 0–t1, as shown in FIG. 2.

Consequently, once the voltage developed across external capacitor C1 becomes higher than the Zener voltage VZ1, only the second current from the second current source CS2 charges the external capacitor C1. After that point, the voltage developed across the external capacitor C1 rises more slowly until it reaches the same level as that of the Zener diode ZD2 (e.g., VZ2).

If a reverse current is detected through Zener diode ZD2, which is indicative of operational troubles within the SMPS, the protection signal generating section PC is activated. Section PC generates a gate cut-off signal which is transmitted to one input of logic gate G1. Gate G1 interrupts the control signal outputted from the comparator U1 responsive to the gate cut-off signal transmitted from the protection signal generating section PC.

However, the conventional SMPS switch-control IC described above has the drawback of being sensitive to temperature changes. In particular, the sensing resistor Rs is a temperature dependent element of the SMPS system which can cause varying amounts of drain current from the switching transistor Rs to be transmitted to comparator U1. Thus, absent a temperature correction means, the limited peak current value will not be kept constant.

Accordingly, the need exists for a power supply switch control whose peak current value is constant an independent of temperature.

SUMMARY OF THE INVENTION

It is an object of the present invention to provide a switch-control integrated circuit for an SMPS which can keep the limited peak current value constant by varying the voltage corresponding to the variation of the detected signal due to the temperature change.

In order to achieve the above object, the present invention comprises a switch-mode power supply (SMPS) capable of consistently limiting the peak current value of an output supply voltage irrespective of a temperature change. The circuit includes a switching transistor of the SMPS and a sensing resistor coupled to a drain of the switching transistor for sensing a drain current of the switching transistor to produce a peak current value detection voltage where the detection voltage is generally variable with a temperature of the sensing resistor. A voltage generating means generates a voltage which varies in proportion to the temperature of the sensing resistor. A comparator compares the temperature dependent voltage, received at a first input, with the temperature dependent peak current value detection voltage, received at a second input, to produce a temperature independent control signal. A protection circuit, coupled between the comparator and the switching transistor, interrupts the control signal if an abnormal operation of the voltage generating section is detected. Finally, a driving circuit drives the switching transistor in response to the control signal transmitted from the protection circuit.

The invention also includes a method for producing a temperature independent peak current from a switch-mode voltage supply output of a type having a temperature sensitive element used for sensing a drain current of a switching transistor of the power supply. The method comprises the steps of detecting a peak current value detection voltage using said temperature sensitive element, said peak current detection voltage being dependent upon a temperature of said temperature sensitive element. A temperature dependent voltage is then generated using a dividing resistor, said temperature dependent voltage being variably proportional to said peak current detection voltage. The temperature dependent voltage is then compared with a peak current value detection voltage a control signal is output for turning off said switching transistor responsive to said compared voltages.

BRIEF DESCRIPTION OF THE DRAWINGS

The above object, other features and advantages of the present invention will become more apparent by describing a preferred embodiment thereof with reference to the accompanying drawing, in which.

DETAILED DESCRIPTION OF THE PREFERRED EMBODIMENT

Figure 3:
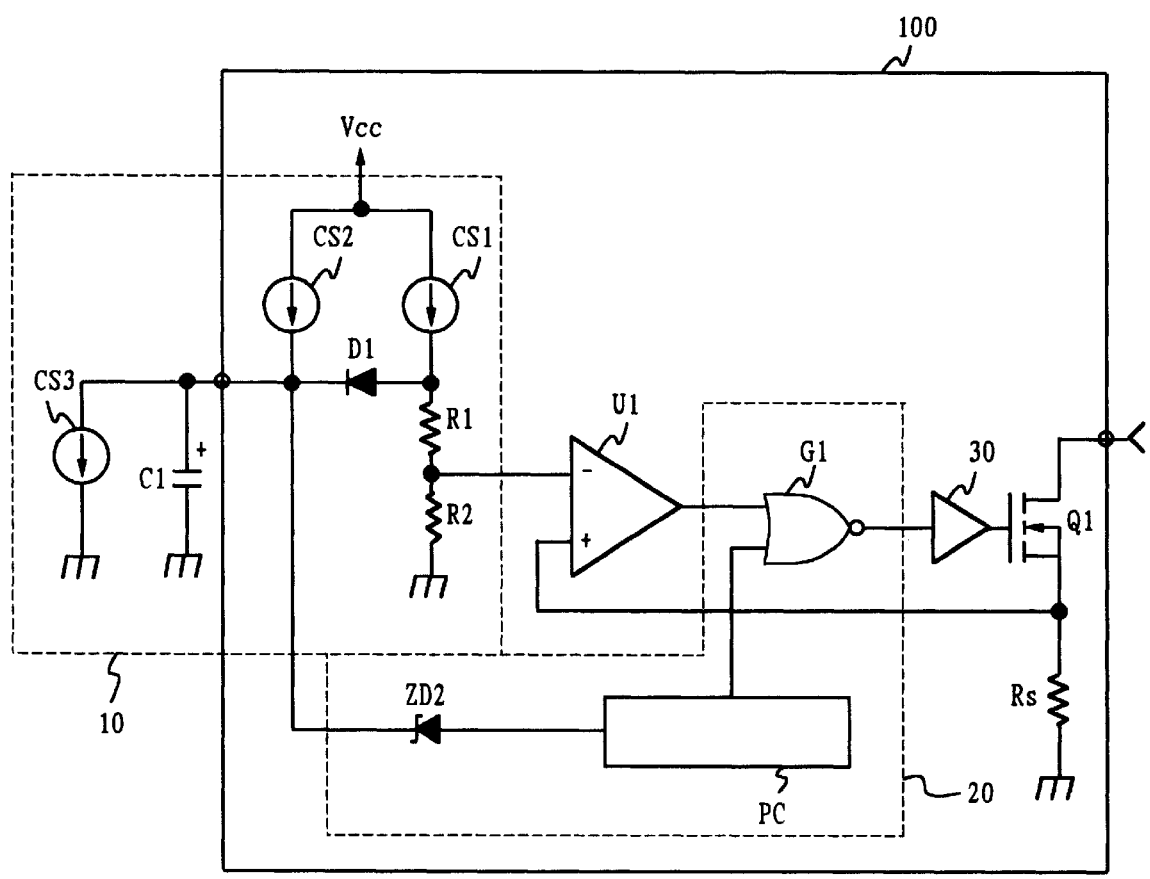
FIG. 3 is a schematic circuit diagram of a switch-control integrated circuit for a switch-mode power supply constructed according to the present invention.

FIG. 3 shows an exemplary switch-control integrated circuit for a switch-mode power supply (SMPS) constructed according to the present invention.

Referring to FIG. 3, the present switch-control circuit includes an integrated circuit 100 in which a switching transistor Q1, a voltage generating section 11, a protection circuit section 20, a comparator U1, a driving section 30, and a sensing resistor Rs are integrated onto a single semiconductor substrate. The switch control circuit constructed according to the present invention also includes an external capacitor C1 and an external current sink CS3.

Specifically, the switch-control integrated circuit for an SMPS constructed according to the present invention includes a switching transistor Q1 of the SMPS, and a sensing resistor Rs coupled to the drain electrode of transistor Q1 for sensing a drain current of the switching transistor Q1 to produce a peak current value detection voltage. A novel, temperature dependent voltage generating circuit 11 generates a voltage, which is transmitted in parallel to the peak current voltage from transistor Q1, to a comparator U1. Preferably, the temperature dependency of circuit 11 has a variability equal to that of sensing resistor Rs. Comparator U1 produces a control signal for adjusting the duty cycle of the switching transistor Q1 in response to the two input signals.

The switch-control integrated circuit also includes a protection circuit 20 coupled between the comparator and switching transistor Q1 for interrupting the control signal from comparator U1 if an abnormal operation of the voltage generating section 11 is detected. Finally, the conventional switch control IC includes a driving circuit 30 for driving the switching transistor Q1 in response to the control signal transmitted from the protection circuit 20.

The novel, temperature dependent voltage generating circuit 11 constructed according to the invention includes a first current source CS1 for providing a first constant current I1 to a first node N1. Novel circuit 11 also includes a second current source CS2 for providing a second constant current I2, which is less than the first constant current I1, to a second node N2. A diode D1 is coupled forwardly between the first node N1 and the second node N2, and a dividing resistors, R1 and R2, are coupled between the first node N1 and ground. An external capacitor C1 is coupled to the second node N2, and an external current sink CS3 is coupled to the second node N2.

The protection circuit 20 includes a second Zener diode ZD2 which is turned on if a terminal voltage of the external capacitor C1 becomes greater than the Zener voltage VZ2 of the second Zener diode ZD2. A protection signal generating section PC produces a protection (i.e., cut-off control) signal if a reverse current through the Zener diode ZD2 is detected. Finally, a gate G1 regulates the transmission of the control signal to the driving circuit 30 and then the switching transistor Q1 in response to the protection signal.

The operation of the switch-control integrated circuit for an SMPS according to the present invention as constructed above will now be explained with reference to FIG. 3.

During normal operation of the SMPS, the external capacitor C1 is charged by the first constant current and the second constant current (i.e., from sources CS1 and CS2, respectively). The energy then stored in the external capacitor C1 is discharged through an external current sink CS3.

At this time, if the voltage developed in the external capacitor C1 becomes greater than the terminal voltage of the dividing resistors R1 and R2, the first constant current I1 provided from the first current source CS1 is cut off by the diode D1. The external capacitor C1 subsequently is charged only by the second constant current I2 supplied by the second current source CS2. Accordingly, the voltage developed across the external capacitor C1 rises more slowly until it reaches the same magnitude as that of Zener diode ZD2 (e.g., VZ2).

If a reverse current is detected through Zener diode ZD2, which is indicative of operational troubles within the SMPS, the protection signal generating section PC is activated. Section PC generates a gate cut-off signal which is transmitted to one input of logic gate G1. Gate G1 interrupts the control signal outputted from the comparator U1 responsive to the gate cut-off signal transmitted from the protection signal generating section PC.

Figure 1:
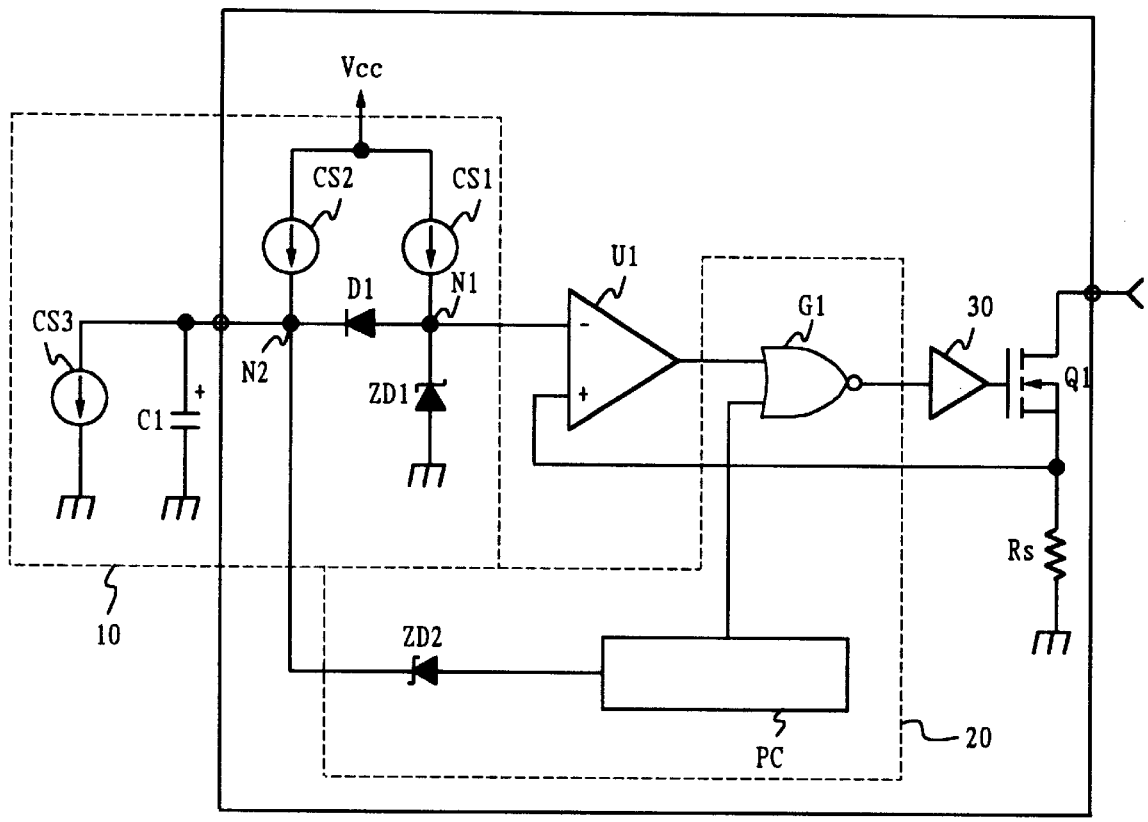
FIG. 1 is a schematic circuit diagram of a conventional switch-control integrated circuit for a two-phase switch-mode power supply.
Figure 2:
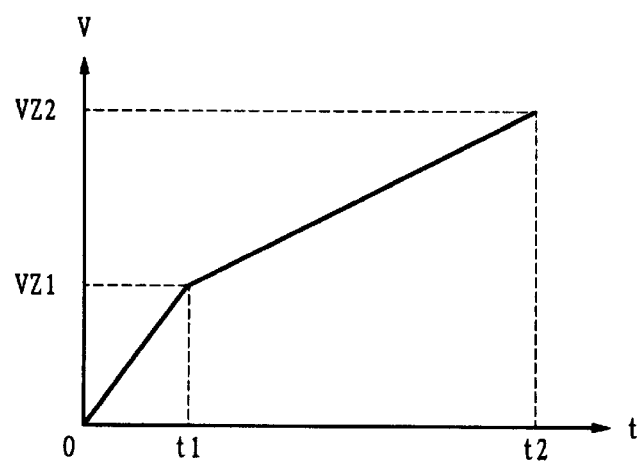
FIG. 2 is a graph showing the charging characteristics of the circuit of FIG. 1 over time.

According to the present invention, the Zener diode ZD1 which was employed in the conventional circuit of FIG. 1 has been replaced by a temperature dependent component, such as the dividing resistors R1 and R2 as shown in FIG. 3.

The sensing resistor Rs and the dividing resistors R1 and R2 are formed on the same semiconductor substrate, and thus have substantially the same temperature coefficient. Accordingly, as the resistance value of the sensing resistor Rs varies in accordance with the temperature change, causing the value of the detected signal to vary accordingly, the voltage produced on the terminal of the dividing resistor R2 also varies in accordance with the same temperature change, i.e., in proportion to the variation of the detected signal caused by the temperature change. As a result, the peak current can be consistently limited.

From the foregoing, it will be apparent that the switch-control integrated circuit according to the present invention provides the advantages in that it can keep the limited peak current value constant as well as perform its own control function in the SMPS.

While the present invention has been described and illustrated herein with reference to the preferred embodiment thereof, it will be understood by those skilled in the art that various changes in form and details may be made therein without departing from the spirit and scope of the invention.

What is claimed is:

1. A switch-control integrated circuit for a switch-mode power supply comprising:
    a switching transistor of said switch-mode power supply;
    a sensing resistor coupled between a ground and a drain of said switching transistor for sensing a drain current of said switching transistor and producing a peak current value detection voltage generally variable with a temperature of the sensing resistor;
    voltage generating means for generating a voltage which varies depending on a temperature condition equal to that of said sensing resistor, said voltage generator means including:
        a first current source for providing a first constant current to a first node;
        a second current source for providing a second constant current which is less than said first constant current to a second node;
        a diode coupled forwardly between said first and second nodes;
        an external capacitor coupled to said second node;
        an external current sink coupled to said second node;
        dividing resistor means, coupled between said first node and ground, for producing said voltage;
    a comparator for comparing said voltage with said peak current value detection voltage and producing a control signal, said control signal turning off said switching transistor;
    protection circuit means for interrupting output of said control signal if an abnormal operation of said voltage generating means is detected; and
    driving means for driving said switching transistor in response to said control signal provided from said protection circuit means.

2. A switch-control integrated circuit as claimed in claim 1, wherein said protection circuit means comprises:
    a Zener diode which is turned on if a terminal voltage of said external capacitor becomes greater than a Zener voltage of said Zener diode;
    protection signal generating means coupled rearwardly of said Zener diode for producing a protection signal if a reverse current through said Zener diode is detected; and
    a logic gate adapted to receive the control signal at a first input and the protection signal at a second input, and gating the output of said control signal in response to said protection signal.

3. A temperature dependent feedback circuit for use in an integrated circuit comprising:
    a first current source for providing a first constant current to a first node;
    a second current source for providing a second constant current which is less than said first constant current to a second node;
    a diode coupled forwardly between said first and second nodes;
    an external capacitor coupled to said second node;
    an external current sink coupled to said second node; and
    a dividing resistor, coupled between said first node and ground, for producing a voltage.

4. A method for producing a temperature independent peak current from a switch-mode voltage supply output of a type having a temperature sensitive element used for sensing a drain current of a switching transistor of the power supply, the method comprising the steps of:
    detecting a peak current value detection voltage using said temperature sensitive element, said peak current detection voltage being dependent upon a temperature of said temperature sensitive element;
    generating a temperature dependent voltage using a dividing resistor, said temperature dependent feedback voltage being variably proportional to said peak current detection voltage;
    comparing said temperature dependent voltage with a peak current value detection voltage; and
    outputting a control signal for turning off said switching transistor responsive to said compared voltages.

5. The method according to claim 4, further comprising:
    detecting an abnormal value of the temperature dependent voltage; and
    interrupting said control signal when said abnormal value is detected.

6. The method according to claim 5 wherein said step of detecting an abnormal value of the temperature dependent voltage includes:
    providing a Zener diode;
    detecting a reverse current through said Zener diode; and
    generating a cut-off control signal when said reverse current is detected.

* * * * *

UNITED STATES PATENT AND TRADEMARK OFFICE
CERTIFICATE OF CORRECTION

PATENT NO.    : 5,825,234  
DATED         : October 10, 1998  
INVENTOR(S)   : Hwan-Ho Sung and Sang-Hoon Jeong Page 1 of 1

It is certified that error appears in the above-identified patent and that said Letters Patent is hereby corrected as shown below:

<u>Column 1,</u>  
Line 35, "12" should read -- I2 --;

<u>Column 2,</u>  
Line 51, "an" should read -- and --.

Signed and Sealed this

Twenty-first Day of May, 2002

Attest:

Attesting Officer

JAMES E. ROGAN  
Director of the United States Patent and Trademark Office